United States Patent
Bergervoet et al.

(10) Patent No.: US 12,211,840 B2
(45) Date of Patent: Jan. 28, 2025

(54) METAL OXIDE SEMICONDUCTOR DEVICE

(71) Applicant: NXP B.V., Eindhoven (NL)

(72) Inventors: Jozef Reinerus Maria Bergervoet, Eindhoven (NL); Xin Yang, Houten (NL); Mark Pieter van der Heijden, Eindhoven (NL); Lukas Frederik Tiemeijer, Eindhoven (NL); Alessandro Baiano, Nijmegen (NL)

(73) Assignee: NXP B.V., Eindhoven (NL)

( * ) Notice: Subject to any disclaimer, the term of this patent is extended or adjusted under 35 U.S.C. 154(b) by 422 days.

(21) Appl. No.: 17/644,138

(22) Filed: Dec. 14, 2021

(65) Prior Publication Data

US 2022/0199617 A1 Jun. 23, 2022

(30) Foreign Application Priority Data

Dec. 21, 2020 (EP) .................................... 20215937

(51) Int. Cl.
*H01L 27/08* (2006.01)
*H01L 21/8234* (2006.01)
*H01L 23/528* (2006.01)
*H01L 27/088* (2006.01)
*H01L 23/532* (2006.01)

(52) U.S. Cl.
CPC .... *H01L 27/088* (2013.01); *H01L 21/823475* (2013.01); *H01L 23/528* (2013.01); *H01L 23/53257* (2013.01)

(58) Field of Classification Search
CPC ........... H01L 27/088; H01L 21/823475; H01L 23/528; H01L 23/53257
USPC ........................................................ 257/690
See application file for complete search history.

(56) References Cited

U.S. PATENT DOCUMENTS

| 10,158,002 B2 | 12/2018 | Al-Sa'Di et al. |
| 2013/0168873 A1 | 7/2013 | Lee et al. |
| 2014/0027862 A1 | 1/2014 | Herberholz |
| 2016/0086934 A1 | 3/2016 | Huitsing et al. |
| 2020/0020779 A1 | 1/2020 | Trang et al. |

(Continued)

FOREIGN PATENT DOCUMENTS

| JP | H09181324 A | * 7/1997 | ....... H01L 21/02667 |
| KR | 20170115641 A | * 10/2017 | ......... H01L 27/1225 |

*Primary Examiner* — Phuc T Dang

(57) ABSTRACT

A metal oxide semiconductor, MOS, device (405) is described that includes a gate terminal, at least one source terminal and at least one drain terminal, wherein at least one source terminal and at least one drain terminal are formed of metal and are connected to a number of respective contact vias. A plurality of local interconnect layers, LIL, (470) are connected respectively to the least one source terminal and at least one drain terminal through the number of respective contact vias, wherein the at least one source terminal and the at least one drain terminal respectively connected to the plurality of LIL (470) are configured such that: the at least one source terminal and the at least one drain terminal do not overlap in a first direction (602) and a second direction (604) that is orthogonal to the first direction (602); and the at least one source terminal and the at least one drain terminal do not overlap or only a proportion of the at least one source terminal and the at least one drain terminal overlap in a third direction (606), where the third direction (606) is orthogonal to both the first direction (602) and the second direction (604).

10 Claims, 5 Drawing Sheets

(56) References Cited

U.S. PATENT DOCUMENTS

2020/0098676 A1\*   3/2020   Elsherbini ............... H01L 23/36
2020/0411427 A1\*  12/2020   Lin ...................... H01L 23/528
2021/0134964 A1\*   5/2021   Ho ...................... H01L 23/5283

\* cited by examiner

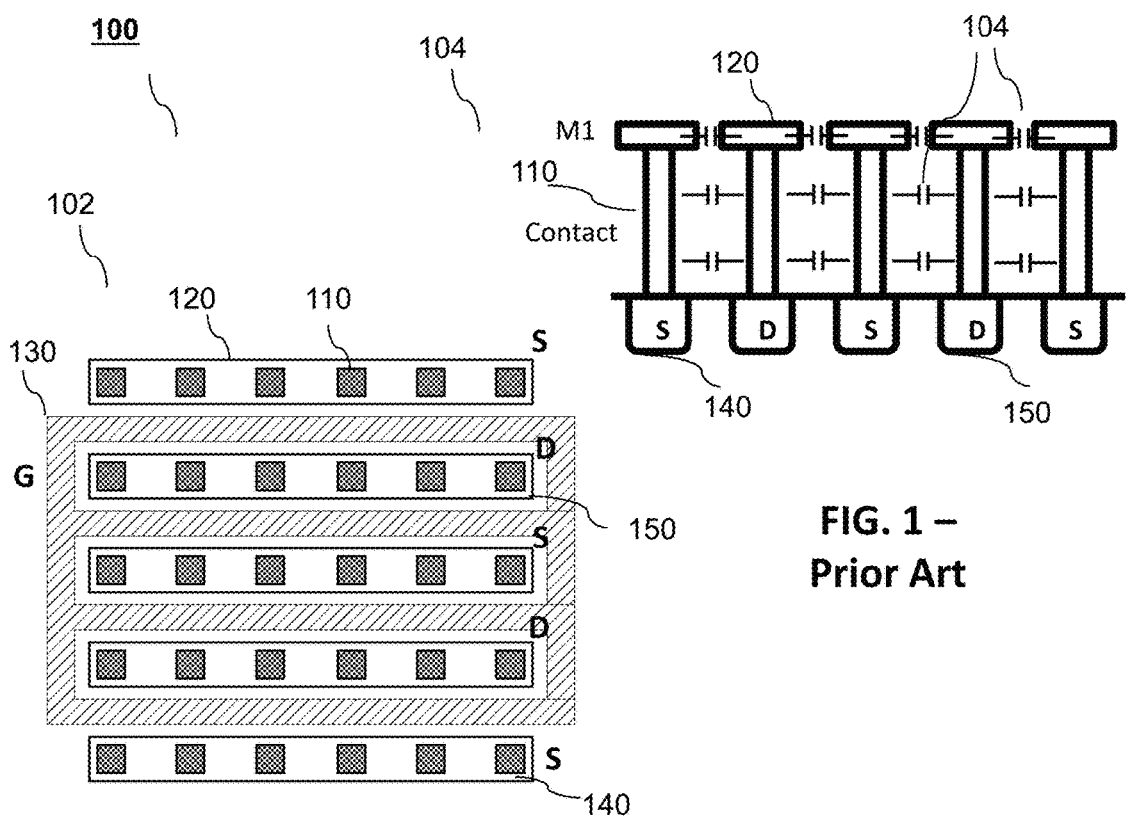
FIG. 1 – Prior Art
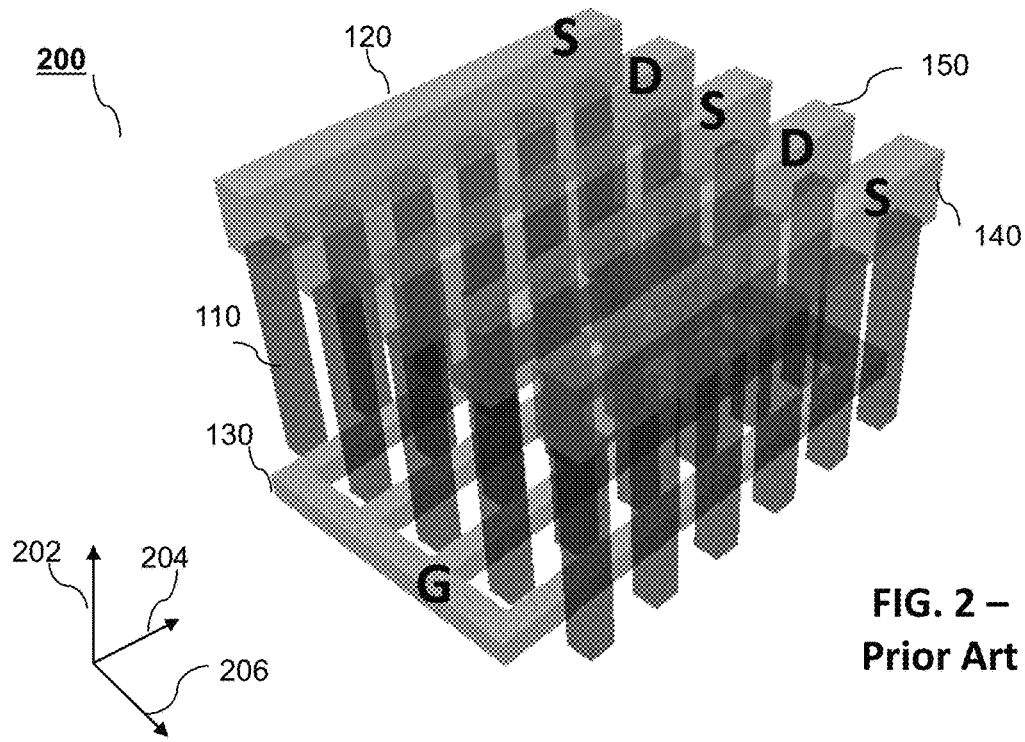
FIG. 2 – Prior Art

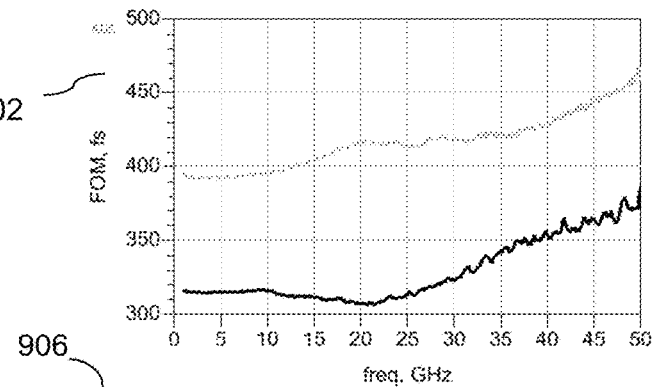

FIG. 9

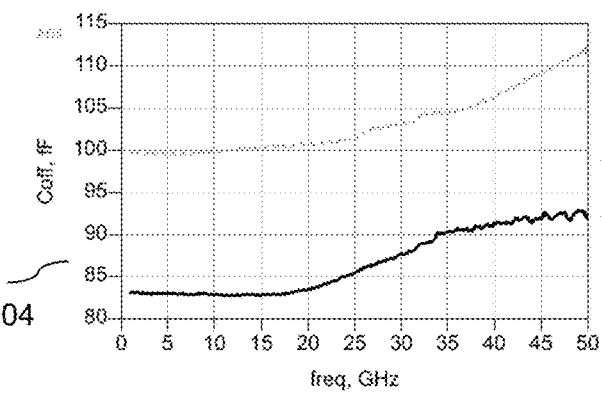
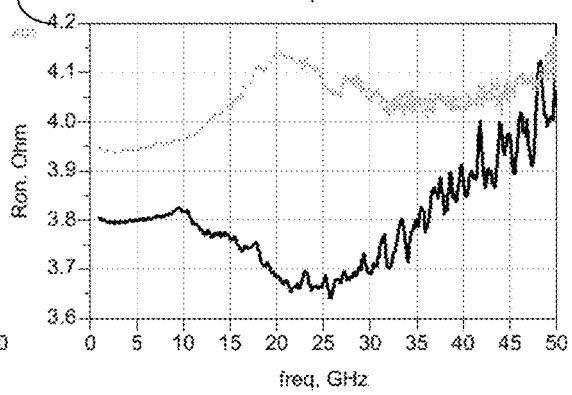

FIG. 10

1000 — 1002: Define active area(s) for source and drain in the silicon, where the source and drain areas do not overlap in a first direction or a second direction orthogonal to the first direction, and do not overlap or only partially overlap in a third direction that is orthogonal to both the first and second directions 1004: Form polygate 1006: Open contact slits 1008: Introduce Local interconnect Layers (LIL) on top of the source and drain active areas in a second direction 1010: Add contacts 1012: Add M1 metal layer

METAL OXIDE SEMICONDUCTOR DEVICE

CROSS-REFERENCE TO RELATED APPLICATIONS

This application claims the priority under 35 U.S.C. § 119 of European Patent application no. 20215937.2, filed on 21 Dec. 2020, the contents of which are incorporated by reference herein.

FIELD OF THE INVENTION

The field of the invention relates to a Metal Oxide Semiconductor (MOS) device and a method therefor. The invention is applicable to, but not limited to, a MOS device with a plurality of local interconnect layers (LIL).

BACKGROUND OF THE INVENTION

In the field of digital, analog, power and radio frequency (RF) engineering, metal oxide semiconductor (MOS, also known as metal-oxide-silicon) devices are very popular for amplification and switching applications. The term 'MOS' typically refers to a metal gate, oxide insulation, and semiconductor (typically silicon) device. MOS field-effect transistors (MOSFETs), are a type of insulated-gate FET that is fabricated by a controlled oxidation of a semiconductor, typically silicon. However, the reference to 'metal' in the name MOSFET is often a misnomer, because the gate material is often a layer of polysilicon (polycrystalline silicon). Furthermore, different dielectric materials as an alternative to oxide, can also be used with the aim of obtaining strong electrical channels with smaller applied voltages.

In a MOS device, the voltage of a covered gate determines the electrical conductivity of the device; and this ability to change conductivity with the amount of applied voltage can be used for amplifying or switching electronic signals. It is a compact transistor that has been miniaturised and mass-produced for a wide range of applications, revolutionizing the electronics industry enabling high-density integrated circuits (ICs), such as memory chips and microprocessors to be used and produced en masse. The MOSFET is considered the 'workhorse' of the electronics industry.

FIG. 1 illustrates a simplified known top layout view 102 and a front view 104 of a conventional MOS switch device 100. In the known top layout view 102, the MOS switch device terminals include a Gate (G) 130, at least one Drain (D) 150 and at least one Source (S) 140, respectively. The hashed gate area refers to a polycrystalline silicon region of the conventional MOS switch device 100, with the dark gray squares illustrating contact vias 110 and the unshaded areas referring to a M1 metal region 120. As illustrated in the front view 104, contact vias 110 overlap wholly in one orthogonal direction between the Drain (D) 150 and Source (S) 140 terminals of MOS switch device 100.

FIG. 2 illustrates a simplified 3-dimensional layout view 200 of the same conventional MOS switch device 100 of FIG. 1. It is known that the adjacent configuration of metal-1 (M1) region 120 layer strips that are connected to source terminals 140 and drain terminals 150 creates an undesirable parasitic capacitance between said drain and source terminals of a MOS device 100.

EP3285286A1 describes a semiconductor manufacturing process using ion implantation that is designed to improve a figure of merit (FOM) of a MOS RF switch device. US2016086934A1 describes a use of a local interconnect layer (LIL) to improve a current handling capacity of collector regions for a bipolar PNP electrostatic discharge (ESD) circuit. In particular, US2016086934A1 describes a technique that keeps the M1 layer and contact vias overlapping in the same manner as the classical MOS configuration approach of FIGS. 1 and 2, and adds a LIL layer to decrease the on-resistance (Ron) & improve current handling capacity.

Hence, an improved design is needed to reduce any occurrence of metal-1 layer strips connected to source and drain terminals being adjacent to each other, which creates an undesirable parasitic capacitance between said drain terminals and source terminals of a MOS device.

SUMMARY OF THE INVENTION

The present invention provides a MOS device and a method of construction therefor, as described in the accompanying claims. Specific embodiments of the invention are set forth in the dependent claims. These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 1 illustrates a simplified known top layout view and front view of a conventional metal oxide semiconductor (MOS) switch device.

FIG. 2 illustrates a simplified 3-dimensional layout view of a conventional metal oxide semiconductor (MOS) switch device.

FIG. 9 illustrates a measured performance (Ron, Coff and FOM) comparison between the conventional MOS switch device and a LIL-enhanced MOS device according to example embodiments of the invention.

FIG. 10 illustrates one example of a simplified flowchart for constructing a metal oxide semiconductor (MOS) device, according to example embodiments of the invention.

DETAILED DESCRIPTION

Figure 3:
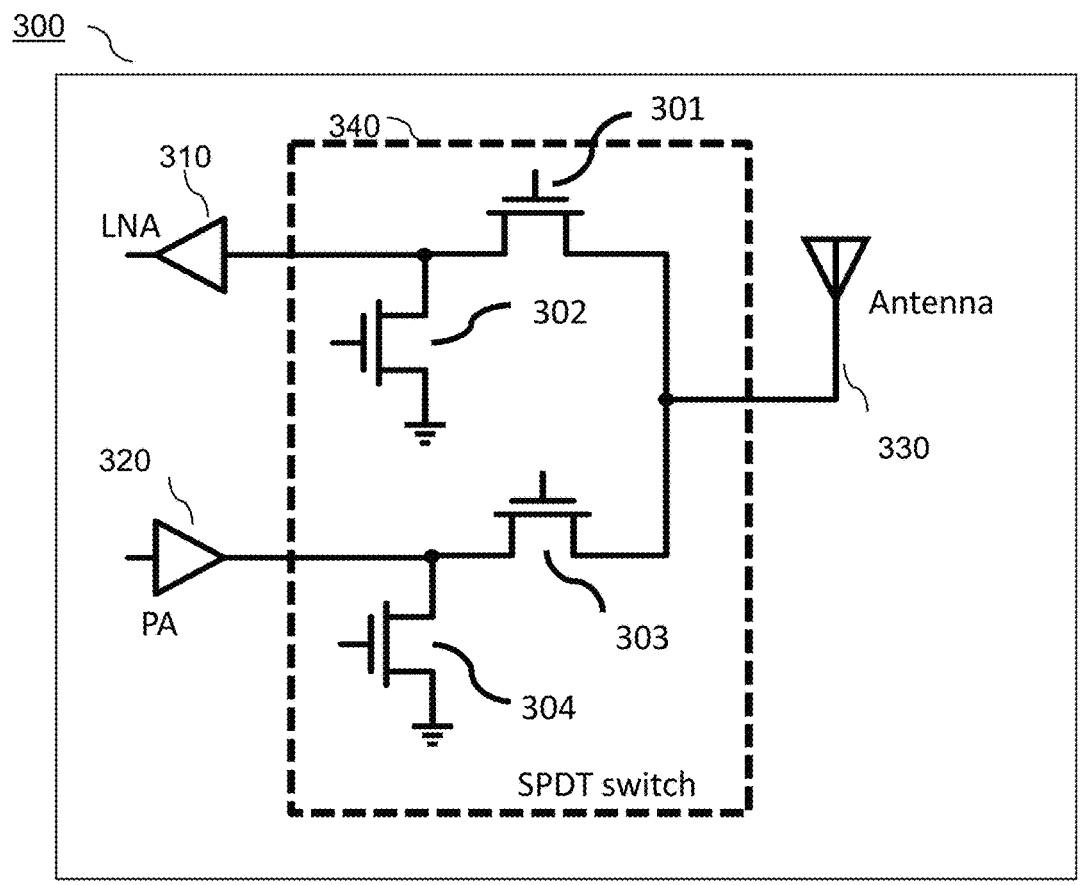
FIG. 3 illustrates one example of a radio frequency (RF) frond-end integrated circuit (IC), configured as a single-pole double-throw (SPDT) switch using metal oxide semiconductor (MOS) switches, according to example embodiments of the invention.

The inventors of the present invention have realised and appreciated (as can be seen in FIG. 2) that when viewed in a first direction 202, the source and drain terminals are separated and do not overlap in that first direction 202. Similarly, when viewed in a second direction 204, orthogonal to the first direction 202, the source and drain terminals are separated and do not overlap in that second direction 204. However, the inventors of the present invention have realised and appreciated (as can be seen in FIG. 2) that when viewed in a third direction 206 that is orthogonal to both the first direction 202 and the second direction 204, the source and drain terminals of a conventional MOS device may be separated but fully overlap in that third direction 206. The inventors of the present invention have realised and appreciated that any reduction in the fully overlapping configuration of the source and drain terminals in that third direction 206 will reduce the created parasitic capacitance between the two terminals.

In a first aspect of the invention, configurations of an example MOS device advantageously reduce the adjacent occurrence of metal-1 layer strips connected to source and drain terminals. In the first aspect, a metal oxide semiconductor, MOS, device comprises a gate terminal, at least one source terminal and at least one drain terminal, wherein the at least one source terminal and at least one drain terminal are formed of metal and are connected to a number of respective contact vias. The MOS device further includes a plurality of local interconnect layers, LIL, connected respectively to the least one source terminal and at least one drain terminal, wherein the at least one source terminal and the at least one drain terminal respectively connected to the plurality of LIL are configured such that the at least one source terminal and the at least one drain terminal do not overlap in a first direction and a second direction that is orthogonal to the first direction; and the at least one source terminal and the at least one drain terminal do not overlap or only a proportion of the at least one source terminal and the at least one drain terminal overlap in a third direction, where the third direction is orthogonal to both the first direction and the second direction.

Consequently, due to the reduction in the adjacent occurrence of metal-1 layer strips connected to source and drain terminals, a reduction in the undesirable parasitic capacitance between the drain terminals and source terminals of a MOS device can be achieved. However, the inventors have recognised and appreciated that removing a number of metal-1 layer strips and contact vias that overlap between the drain and source terminals of MOS a device will increase an on-resistance (Ron) performance of the MOS device, which will, in turn, increase/worsen the MOS device's figure of merit (FOM) performance. Here, the MOS device's figure of merit, FOM=(ON-state resistance of the device) Ron* (OFF-state capacitance) Coff, which will generally improve the performance of a circuit using the device.

Therefore, examples of the present invention introduce a local interconnect layer (LIL) in the MOS device in order to improve Coff and reduce Ron of the MOS device. Such an approach is in direct contrast to the approach adopted in US2016086934A1, which simply added a LIL layer without removing the metal-1 layer strips and contact vias that overlap between the drain and source terminals of the MOS device, which significantly increases the Coff of the MOS device and thereby increase/worsen the MOS device's FOM.

In particular, in some illustrated example configurations, around a half of the typical source and typical drain terminals (or up to a significant proportion, but not all of the typical source and typical drain terminals) are covered by a metal-1 layer. The application of a plurality of LILs in the MOS device, where each LIL is formed across the whole of the typical source and typical drain terminals, enables the at least one source terminal and the at least one drain terminal to avoid being fully overlapped, i.e. not overlapped at all in the third direction or only a proportion of the at least one source terminal and the at least one drain terminal being overlapped in the third direction.

Thus, in some examples, a combination of using a LIL together with removing the previous (known) need for at least some of the metal-1 (M1) and contact vias (that previously fully overlapped in the third direction between the drain and source terminals of the MOS device) enables a reduction of parasitic capacitance between source and drain metal layers to be achieved. In some examples, Local interconnect Layers (LIL) are coupled to the metal-1 layers through contact vias in a manner that facilitates a proportion of the metal-1 layers of source and drain terminals not overlapping in two (first and second) orthogonal directions and only partially, or not overlapping at all in a third orthogonal direction. In this manner, a reduction in a number of contact vias may also be achieved. Thus, in contrast to the known MOS device constructions, where drain and source terminals do not overlap in two orthogonal directions, but fully or substantially overlap in the third orthogonal direction, a reduction of parasitic capacitance between source and drain metal layers to be achieved.

As a result, the MOS device also exhibits a better Figure-of-Merit (FOM) performance, where: FOM=Ron*Coff, which will generally improve the performance of a circuit using this device. Here, Ron is the residual resistance when the MOS device is configured in an 'ON' state (or mode of operation); and Coff is a leak-through capacitance when the MOS device (e.g. configured as a switch) is configured in an 'OFF' state. In the described examples, the term 'metal-1' refers to the first metal to be placed on top of the either the source or drain contacts, and does not impart any further meaning than that. In some examples of the invention, LIL and contact vias may be formed out of, say, tungsten, with metal-1's formed out of, say, aluminum.

Figure 8:
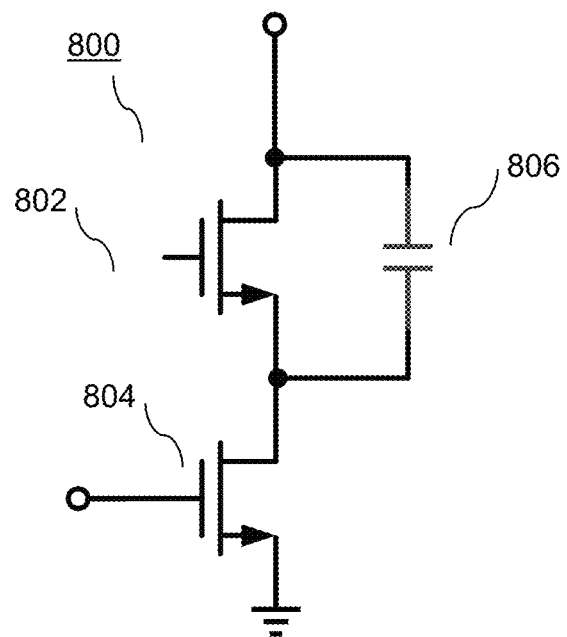
FIG. 8 illustrates one alternative example of a schematic of cascode metal oxide semiconductor (MOS) amplifier that is capable of being implemented using a LIL-enhanced MOS device, according to example embodiments of the invention.

The MOS device according to examples of the invention, e.g. when employed in a radio frequency (RF) single-pole double-throw (SPDT) switch, improves the insertion loss and isolation of a RF SPDT MOS switch device. Although examples of the invention are described with reference to use as a RF SPDT switch in an RFIC, it is envisaged that the concepts described herein have wider applicability in, say, a RF cascode amplifier (as illustrated in FIG. 8), any amplifier using a MOS switch, such as by-pass switch functionality, a voltage controlled oscillator (VCO) with switchable capacitors etc.

Referring first to FIG. 3, one example application of a MOS device configured according to examples of the invention is illustrated. The example application of the MOS device is of an electronic device, for example in a form of a radio frequency (RF) frond-end integrated circuit (IC) of communication unit 300. The illustrated example shows four MOS switch devices configured as a single-pole double-throw (SPDT) switch 340, according to example embodiments of the invention. The communication unit 300 comprises a receiver chain with a low noise amplifier (LNA) 310 and a transmitter chain, culminating in a radio frequency (RF) power amplifier (PA) 320, each comprising distinct circuits and signal paths, and each coupled to an antenna 330 or array of antennas (not shown). Such an arrangement is often referred to as a front-end IC with each MOS device of the SPDT switch 340 independently controlled to alternatively connect the transmit chain or and the receive chain to the antenna 330.

In this example application, the four MOS switch devices include a first MOS receive (Rx) series switch 301, a second MOS receive (Rx) shunt switch 302, a third MOS transmit (Tx) series switch 303, and a fourth MOS Tx shunt switch 304. In a RX mode of operation, fourth MOS Tx shunt switch 304 is turned 'ON' (modelled as Ron), third MOS transmit (Tx) series switch 303 is turned 'OFF' (modelled as Coff). Thus, the third MOS transmit (Tx) series switch 303 provides a capacitive loading at antenna 330 port. Ideally, the capacitive loading should be high-Q (i.e., a low Ron of fourth MOS Tx shunt switch 304) & a low capacitance (i.e., a low Coff of third MOS transmit (Tx) series switch 303) in order to prevent the received signal at the Antenna 330 port from leaking into the PA 320 of the transmit chain.

Furthermore, in the RX mode of operation, the first MOS receive (Rx) series switch 301 is turned 'ON' (modelled as Ron), second MOS receive (Rx) shunt switch 302 is turned 'OFF' (modelled as Coff). The first MOS receive (Rx) series switch 301 provides a path for the received signal at the antenna 330 port to by-pass and be received at the LNA 310 of the receive chain. Ideally, the Ron of the first MOS receive (Rx) series switch 301 should be low in order to decrease the insertion loss of the RF signal path. The second MOS receive (Rx) shunt switch 302 provides a capacitive loading and increases return loss. Hence, ideally, the Coff of second MOS receive (Rx) shunt switch 302 should be as low as possible in order to decrease the capacitive loading.

Alternatively, in a Tx mode of operation, the four MOS switch devices 301, 302, 303, 304 are biased in the opposite condition compared to a Rx mode of operation. That is: the fourth MOS Tx shunt switch 304 is turned 'OFF', third MOS transmit (Tx) series switch 303 is turned 'ON', the first MOS receive (Rx) series switch 301 is turned 'OFF', and the second MOS receive (Rx) shunt switch 302 is turned 'ON'. It is envisaged that in some alternative example implementations, series switches 301 and 303 may be replaced by other elements or circuits, for example a Lambda/4 transmission line or equivalent lumped-LC circuits. In this alternative example implementation, any improvement in the FOM of switch devices 302 and 304 will still improve the isolation and insertion loss of the RFIC of the communication unit 300.

Figure 6:
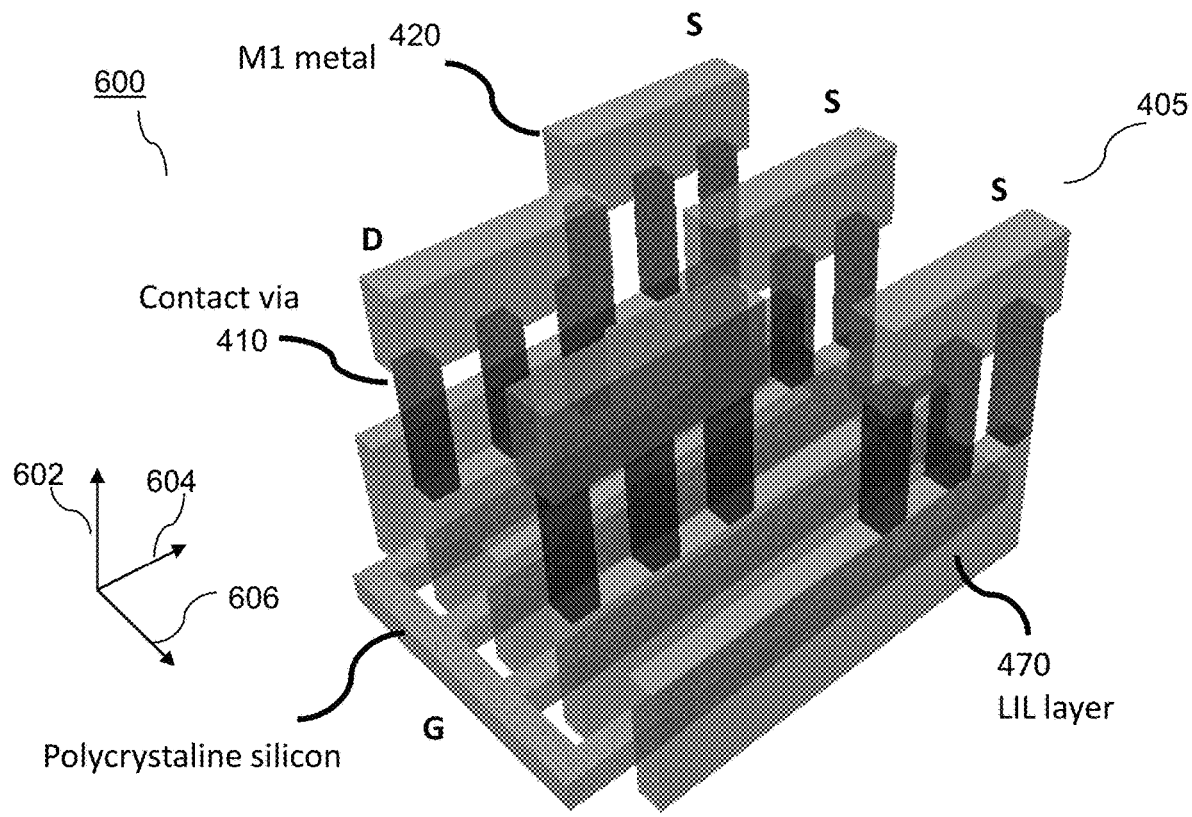
FIG. 6 illustrates a simplified 3-dimensional layout view of a LIL-enhanced metal oxide semiconductor (MOS) switch device, according to example embodiments of the invention.

The leak-through conductance is typically negligible at operation frequencies of >1 GHz. As 'ON'-state losses due to Ron and 'OFF'-state leakage due to Coff both need to be minimized in any radio frequency (RF) application, a MOS device with a smaller FOM is strongly preferred. Using a 'larger' MOS switch is typically undesirable, as it typically reduces Ron, but increases Coff. Therefore, a switch's figure of merit (FOM) has been defined as being FOM=Ron*Coff, and a smaller FOM is then preferred (which takes into account a combination of both Ron and Coff). Stated differently, and assuming a certain amount of insertion loss (for example c.0.5 dB) due to the MOS switch device is acceptable, the smaller the FOM, the higher the frequency at which the MOS switch device can be used. Thus, in order to meet these goals, a MOS device using a LIL has been constructed, where at least some of the metal-1 layer strips and contact vias that overlap between the drain and source terminals in a third direction of the MOS device (where the third direction is orthogonal to the other two orthogonal directions as illustrated in FIG. 2 and FIG. 6) have been removed.

Clearly, the various components within the wireless communication unit 300 can be realized in discrete or integrated component form, with an ultimate structure therefore being an application-specific or design selection.

Figure 4:
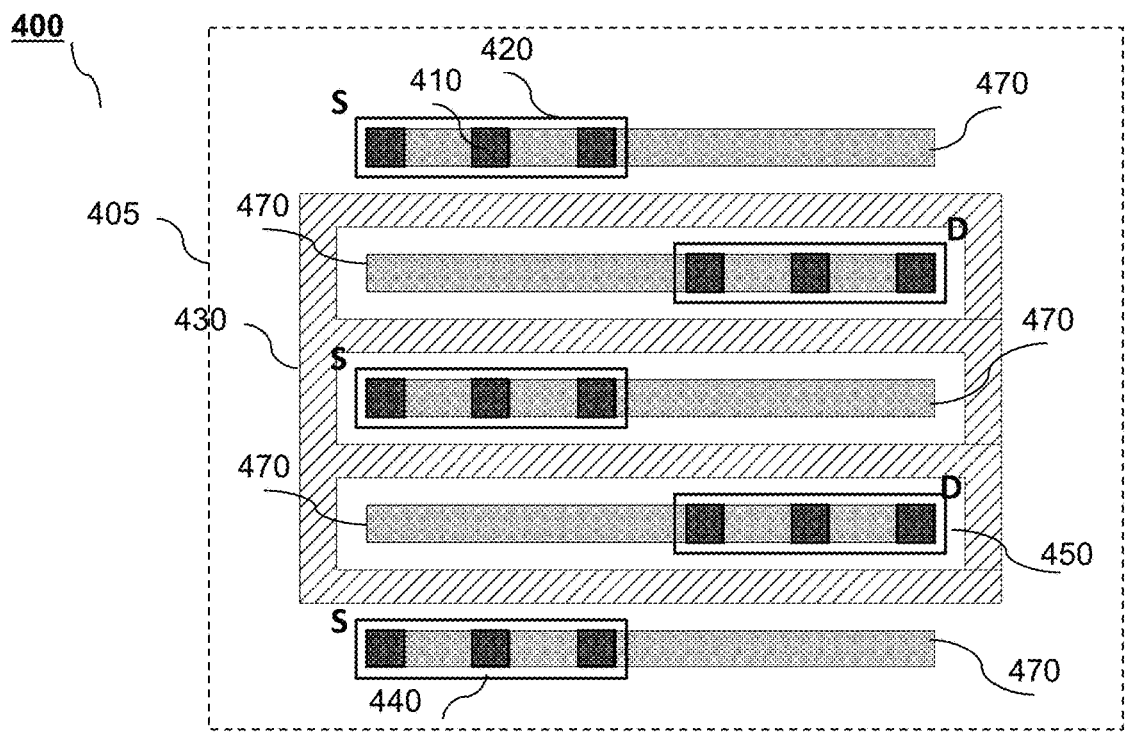
FIG. 4 illustrates a simplified top layout view of a LIL-enhanced metal oxide semiconductor (MOS) switch device, according to example embodiments of the invention.

Referring now to FIG. 4, FIG. 4 illustrates a simplified top layout view 400 of a LIL-enhanced metal oxide semiconductor (MOS) switch device 405, according to example embodiments of the invention. In the top layout view 400 of a LIL-enhanced MOS switch device 405, according to example embodiments of the invention, the MOS switch device 405 terminals are Gate (G) 430, Drain (D) 450 and Source (S) 440, respectively. The hashed gate area refers to a polycrystalline silicon region of the MOS switch device 405, with the dark gray squares illustrating contact vias 410 and the unshaded areas referring to a M1 metal region 420. As illustrated in the top layout view 400, Local interconnect layers (LIL) 470 have been introduced into the design, predominantly removing at least some alternate parts of the M1 metal region 420 forming drain and source terminals and associated contact vias 410 that overlap in the third direction between the drain terminals 450 and source terminals 440 of the MOS switch device 405.

In this example top layout view 400, the respective drain terminals 450 and source terminals 440 of the MOS switch device 405 do not overlap. In this example top layout view 400, the proportion of LIL 470 that is used to replace the M1 metal regions 420 and contact vias 410 is at least or slightly more than half. In other example embodiments, the proportion of LIL 470 that is used to replace the M1 metal regions 420 and contact vias 410 may be more or less than this amount. In preferred examples, the proportion of LIL 470 that is used to replace the M1 metal regions 420 and contact vias 410 is configured such to avoid the avoid source terminal and drain terminal metal-1 layers being adjacent to each other, thereby reducing or minimizing parasitic capacitance between the source terminal and drain terminal metal-1 layers. Hence, in some examples, having only between 40% to 48% of the source terminals and drain terminals covered by a metal-1 layer may be used, with the remaining parts of the source terminals and drain terminals formed by LIL 470 and connected to the metal-1 layers of the source terminals and drain terminals using contact vias 410.

Figure 5:
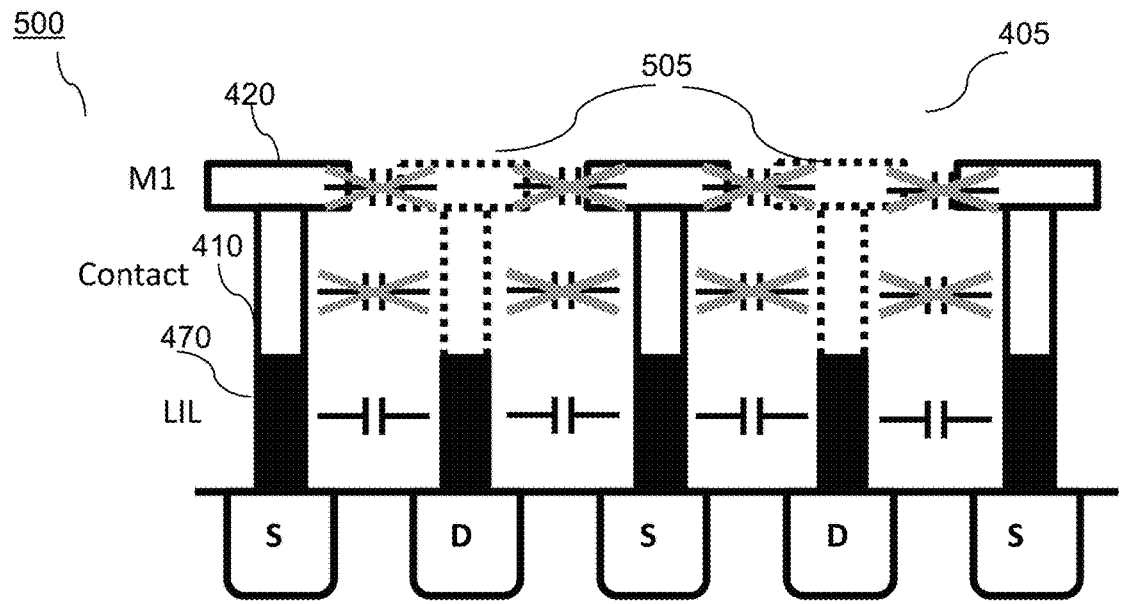
FIG. 5 illustrates a simplified front view of a LIL-enhanced metal oxide semiconductor (MOS) switch device, according to example embodiments of the invention.

Referring now to FIG. 5, FIG. 5 illustrates a simplified front view 500 of the LIL-enhanced MOS switch device 405, according to example embodiments of the invention. FIG. 5 highlights the front view differences between the LIL-enhanced MOS switch device 405, according to example embodiments of the invention, and a corresponding front view 104 of a conventional MOS device 100 as shown in FIG. 1. The dotted lines 505 in FIG. 5 refer to the contact and M1 layer connections to the drain terminals 450 that are located towards the rear of the LIL-enhanced MOS switch device 405, e.g. not overlapping with Source terminal 440. In this manner, any M1 layer-to-M1 layer and Contact-to-Contact capacitance between the source terminal 440 and the drain terminal 450 is decreased, thereby providing a LIL-enhanced MOS switch device 405 that exhibits a lower (improved) Coff. In this example front view 500, the respective drain terminals 450 and source terminals 440 of the MOS switch device 405 do not overlap.

Referring now to FIG. 6, FIG. 6 illustrates a simplified 3-dimensional layout view of the same LIL-enhanced MOS switch device 405, according to example embodiments of the invention. FIG. 6 highlights the 3D layout view differences between the LIL-enhanced MOS switch device 405, according to example embodiments of the invention, and the 3-dimensional layout view 200 of conventional MOS switch device illustrated in FIG. 2. Again, as illustrated in the top layout view 500, Local Interconnect Layers (LIL) 470 have been introduced into the design, predominantly removing at least some alternate parts of the M1 metal region 420 and contact vias 410 that overlap between the drain terminals 450 and source terminals 440 of the MOS switch device 405. In some examples, Local interconnect Layers (LIL) are coupled to the metal-1 layers through contact vias in a manner that facilitates all of the metal-1 layers of source and drain terminals not overlapping in two orthogonal directions 602, 604 and only partially (e.g. a proportion of) overlapping, or not overlapping at all (as illustrated in 606 in this example) in a third orthogonal direction, where the third orthogonal direction is orthogonal to both the first direction 602 and the second direction 604. In this manner, a reduction in a number of contact vias may be achieved. In this example, it is shown that the plurality of LIL 470 are respectively connected to the at least one source terminal and the at least one drain terminal and the plurality of LIL 470 do not overlap in the first direction 602 and do not overlap in the second direction 604. However, the plurality of LIL 470 fully (or in some examples may substantially) overlap in the third direction 606.

The illustrated example shows three contact vias 410 connecting from a LIL (layer) to the M1 metal layer. However, a skilled artisan will appreciate that in a real-life application, the number of contact vias depends on the finger length of the device (e.g. the physical length in orthogonal direction 604).

Figure 7:
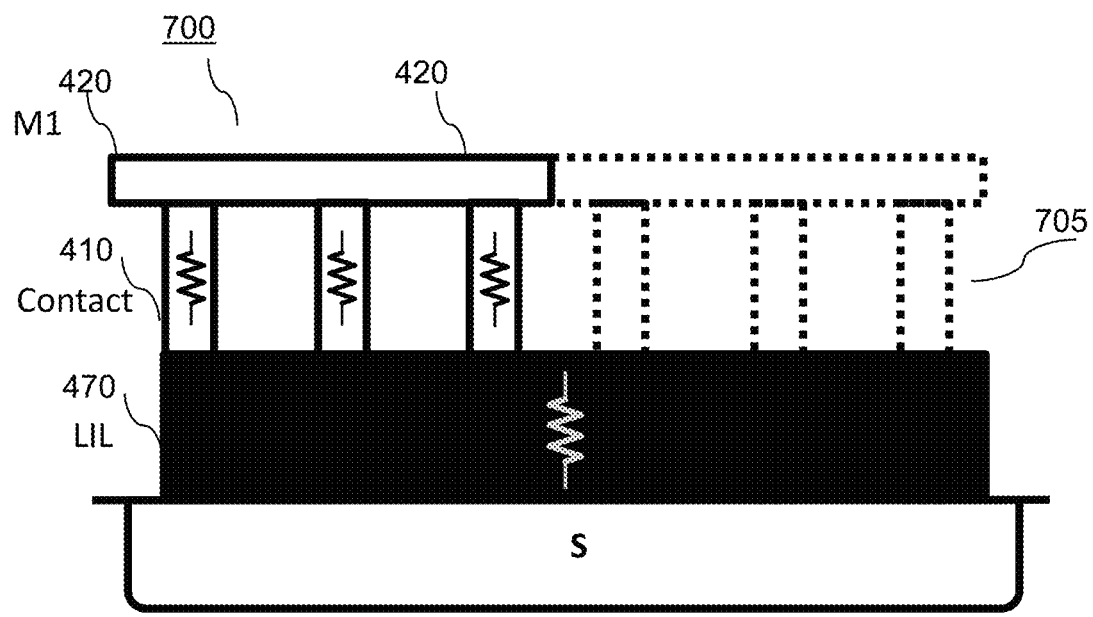
FIG. 7 illustrates a simplified side view of a LIL-enhanced metal oxide semiconductor (MOS) switch device, according to example embodiments of the invention.

Referring now to FIG. 7, FIG. 7 illustrates a simplified side view of a LIL-enhanced MOS switch device 405, according to example embodiments of the invention. FIG. 7 highlights the side view differences between the LIL-enhanced MOS switch device 405, according to example embodiments of the invention, and the conventional and invented LIL enhanced MOS switch device. The dotted lines in FIG. 7 refer to the contact and M1 connection to drain terminals at the rear of the device, as illustrated in FIG. 6.

Although, in this example, the number of contacts is halved, the length of the contact 705 is also almost halved. Thus, the total resistance of a contact connection is similar between the conventional device of FIG. 1 and FIG. 2 and the example LIL-enhanced MOS switch device 405 illustrated in FIGS. 4-7, according to example embodiments of the invention. For completeness, it is noted that a height of LIL 470 should not be too high, as it will introduce too much parasitic capacitance (hence increase Coff). Also, if the LIL 470 is too low, it may introduce too much parasitic resistance (hence increase Ron). Therefore, in preferred examples of the invention a LIL 470 being more or less the same height as half the height of a contact via has been found to be a suitable trade-off between levels of parasitic resistance and parasitic capacitance.

In some examples, the configuration of the MOS device is such that the LIL has more contact area to the source terminal than the drain terminal. Here, the contact resistance between the semiconductor and the metal-1 layer in the LIL-enhanced MOS device, according to examples embodiments of the invention, may be improved. In this instance, although Coff is expected to improve, the on-resistance (Ron) of the LIL-enhanced MOS device, is also typically slightly better (e.g., 5%) than with a conventional MOS device, as the Ron of the intrinsic semiconductor is dominant over any back-end resistance.

Referring now to FIG. 8, FIG. 8 illustrates one alternative example of a schematic of an alternative application of a LIL-enhanced MOS device, for example as a cascode MOS amplifier 800, according to example embodiments of the invention. In this example, the cascode MOS amplifier 800 comprises two MOS device stages 802, 804, with the first MOS device stage 802 being configured as a common-gate stage with an output capacitance 806 that introduces a positive feedback loop. Hence, in this example, decreasing the back-end (BE) parasitic drain-to-source capacitance for the common-gate stage will make the MOS cascode amplifier more stable.

Referring now to FIG. 9, FIG. 9 illustrates graphs 900 of measured performance comparisons between a conventional MOS device 100 of FIG. 1 and FIG. 2 and a LIL enhanced MOS device 405 of FIGS. 4-7. Here, a first graph 902 indicates a Figure of Merit improvement of 20% between a LIL enhanced MOS device 405 and the conventional MOS device 100. A second graph 904 indicates a parasitic capacitance of 15%+ improvement between a LIL enhanced MOS device 405 and the conventional MOS device 100. A third graph 906 indicates an on-resistance improvement of 5-10%+ between a LIL enhanced MOS device 405 and the conventional MOS device 100. Thus, the illustrated graphs 900 of measured performance highlight both lower parasitic capacitance, Coff, and lower on-resistance, Ron, from dc to 50 GHz, of the MOS device using LIL 470 to replace or remove at least some of the known source and drain metal layers and contact vias connected thereto. In this manner, the MOS device using LIL 470 thereby provides an improved FOM over the whole practical frequency band for using MOS devices.

Referring now to FIG. 10, FIG. 10 illustrates one example of a simplified flowchart 1000 for constructing a MOS device, according to example embodiments of the invention, according to some example embodiments of the invention. The flowchart 1000 includes, at 1002, defining a first active area to form at least one source terminal and defining a second active area to form at least one drain terminal in silicon of the MOS device, such that: (i) the first active area forming the at least one source terminal does not overlap in a first direction 602 with the second active area forming the at least one drain terminal; (ii) the first active area forming the at least one source terminal does not overlap in a second direction 604 that is orthogonal to the first direction 602 with the second active area forming the at least one drain terminal, and (iii) the first active area forming the at least one source terminal does not overlap or partially overlaps in a third direction 606 with the second active area forming the at least one drain terminal, where the third direction 606 is orthogonal to both the first direction 602 and second direction 604. When constructing a MOS device the 'active area' is defined by the oxide definition mask, which is the silicon substrate area delimited by isolation oxide (Shallow Trench Isolation), where the poly crystalline silicon gate (sometimes referred to as 'polygate') is deposited and then source and drain implanted to create the source (terminals) and drain (terminals) in the silicon area's not covered by polygate.

The flowchart 1000 further includes, at 1004, forming a polygate and at 1006 opening contact slits. In some alternative examples of the invention, for example with advanced MOS devices, the silicon may be replaced by metal (referred to as 'metalgate') for better performance, such as a better resistance and/or a better work-function resulting in a lower threshold voltage. The flowchart 1000 further includes, at 1008, introducing Local interconnect Layers (LIL) on top (or bottom, dependent upon the orientation) of and connected to the at least one source and drain areas (e.g., terminals) in the first direction, where the LIL overlap substantially or fully with each other in the second orthogonal direction.

The flowchart 1000 further includes, at 1010, introducing contact vias in a second orthogonal direction between the LIL and the source and drain areas and, at 1012, introducing M1 metal layer(s).

In some examples, the flowchart 1000 of the constructing of a MOS device 405 may further include providing a reduced adjacent occurrence of metal-1 layer strips forming the at least one source terminal and the at least one drain terminal overlapping in the third direction 606, thereby providing a reduced parasitic capacitance therebetween.

In some examples, the flowchart 1000 of the constructing of a MOS device 405 may further include connecting the at least one source terminal to a first half of a respective first LIL 470 and connecting the at least one drain terminal to a second opposite half of a respective second LIL 470, wherein the at least one source terminal and the at least one drain terminal do not overlap in the third direction 606, thereby forming alternate source terminal(s) and drain terminal(s) across a plurality of LILs 470.

In this method, the Local interconnect Layers (LIL) are coupled to the metal-1 layers through contact vias in a manner that facilitates a proportion of the metal-1 layers of source and drain terminals not overlapping in two orthogonal directions and not overlapping (or at least only partially overlapping) in the third orthogonal direction.

A skilled artisan will appreciate that the above order of construction is just one possible example, and that the MOS device can be constructed using a different order of steps according to a desired manufacturing process.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

In some examples, the circuits may be implemented using discrete components and circuits, whereas in other examples the circuit may be formed in integrated form in an integrated circuit. Because the illustrated embodiments of the present invention may, for the most part, be implemented using electronic components and circuits known to those skilled in the art, details have not been explained in any greater extent than that considered necessary as illustrated below, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals. Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, the illustrated examples may be implemented as circuitry located on a single integrated circuit or within a same device, for example, as illustrated in the MOS device 405 of FIG. 6 when implemented in an RF SPDT RFIC. Alternatively, the circuit and/or component examples may be implemented as any number of separate integrated circuits or separate devices interconnected with each other in a suitable manner. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A metal oxide semiconductor, MOS, device comprising:
   a gate terminal, at least one source terminal and at least one drain terminal, wherein the at least one source terminal and at least one drain terminal are formed of metal and are connected to a number of respective contact vias;
   wherein the MOS device is characterised by a plurality of local interconnect layers, LIL, connected respectively to the least one source terminal and at least one drain terminal through the number of respective contact vias, wherein the at least one source terminal and the at least one drain terminal respectively connected to the plurality of LIL are configured such that:
  (i) the at least one source terminal and the at least one drain terminal do not overlap in a first direction and a second direction that is orthogonal to the first direction; and
  (ii) the at least one source terminal and the at least one drain terminal do not overlap or only a proportion of the at least one source terminal and the at least one drain terminal overlap in a third direction, where the third direction is orthogonal to both the first direction and the second direction; and
wherein the plurality of LIL, respectively connected to the one source terminal and the at least one drain terminal do not overlap in the first direction and do not overlap in the second direction and the plurality of LIL fully or substantially overlap in the third direction.

2. The MOS device of claim 1 wherein the gate terminal is formed of a polycrystalline silicon layer or a metal layer.

3. The MOS device of claim 1 wherein the at least one source terminal and at least one drain terminal is formed out of aluminium and the plurality of LIL and contact vias are formed out of tungsten.

4. A communication unit comprising the MOS device according to claim 1.

5. The MOS device of claim 1 wherein a first set of respective contact vias connecting a first LIL to the at least one drain terminal and a second set of respective contact vias connecting a second LIL to the at least one source terminal are arranged such that:
  (i) the first set of respective contact vias and the second set of respective contact vias do not overlap in the first direction and do not overlap in the second direction; and
  (ii) the first set of respective contact vias and the second set of respective contact vias do not overlap or only a proportion of the first set of respective contact vias and the second set of respective contact vias overlap in the third direction.

6. The MOS device of claim 1 wherein the at least one source terminal and the at least one drain terminal do not overlap or only a proportion of the at least one source terminal and the at least one drain terminal overlap in the third direction, which provides a reduced adjacent occurrence of metal-1 layer strips forming the at least one source terminal and the at least one drain terminal and a reduced parasitic capacitance therebetween.

7. The MOS device of claim 1 wherein the at least one source terminal and at least one drain terminal is formed out of aluminium and the plurality of LIL and contact vias are formed out of tungsten.

8. A metal oxide semiconductor, MOS, device comprising:
  a gate terminal, at least one source terminal and at least one drain terminal, wherein the at least one source terminal and at least one drain terminal are formed of metal and are connected to a number of respective contact vias;
  wherein the MOS device is characterised by a plurality of local interconnect layers, LIL, connected respectively to the least one source terminal and at least one drain terminal through the number of respective contact vias, wherein the at least one source terminal and the at least one drain terminal respectively connected to the plurality of LIL are configured such that:
    (i) the at least one source terminal and the at least one drain terminal do not overlap in a first direction and a second direction that is orthogonal to the first direction; and
    (ii) the at least one source terminal and the at least one drain terminal do not overlap or only a proportion of the at least one source terminal and the at least one drain terminal overlap in a third direction, where the third direction is orthogonal to both the first direction and the second direction; and
  wherein a first set of respective contact vias connecting a first LIL to the at least one drain terminal and a second set of respective contact vias connecting a second LIL to the at least one source terminal are arranged such that:
    (i) the first set of respective contact vias and the second set of respective contact vias do not overlap in the first direction and do not overlap in the second direction; and
    (ii) the first set of respective contact vias and the second set of respective contact vias do not overlap or only a proportion of the first set of respective contact vias and the second set of respective contact vias overlap in the third direction.

9. A metal oxide semiconductor, MOS, device comprising:
  a gate terminal, at least one source terminal and at least one drain terminal, wherein the at least one source terminal and at least one drain terminal are formed of metal and are connected to a number of respective contact vias;
  wherein the MOS device is characterised by a plurality of local interconnect layers, LIL, connected respectively to the least one source terminal and at least one drain terminal through the number of respective contact vias, wherein the at least one source terminal and the at least one drain terminal respectively connected to the plurality of LIL are configured such that:
    (i) the at least one source terminal and the at least one drain terminal do not overlap in a first direction and a second direction that is orthogonal to the first direction; and
    (ii) the at least one source terminal and the at least one drain terminal do not overlap or only a proportion of the at least one source terminal and the at least one drain terminal overlap in a third direction, where the third direction is orthogonal to both the first direction and the second direction; and
  wherein the at least one source terminal and the at least one drain terminal do not overlap or only a proportion of the at least one source terminal and the at least one drain terminal overlap in the third direction, which provides a reduced adjacent occurrence of metal-1 layer strips forming the at least one source terminal and the at least one drain terminal and a reduced parasitic capacitance therebetween.

10. The MOS device of claim 9, wherein the at least one source terminal and the at least one drain terminal do not overlap in the third direction as the at least one source terminal is connected to first half of a respective first LIL and the at least one drain terminal is connected to a second opposite half of a respective second LIL thereby forming alternate source terminal(s) and drain terminal(s) across a plurality of LILs.

* * * * *